(12) United States Patent
Morzano et al.

(10) Patent No.: US 7,379,377 B2
(45) Date of Patent: *May 27, 2008

(54) MEMORY ARRAY DECODER

(75) Inventors: Christopher K. Morzano, Boise, ID (US); Jeffrey P. Wright, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/698,467

(22) Filed: Jan. 26, 2007

(65) Prior Publication Data

US 2007/0121416 A1    May 31, 2007

Related U.S. Application Data

(60) Division of application No. 11/316,377, filed on Dec. 22, 2005, now Pat. No. 7,245,550, which is a continuation of application No. 10/887,616, filed on Jul. 9, 2004, now Pat. No. 7,009,911.

(51) Int. Cl.
*G11C 8/00* (2006.01)
(52) U.S. Cl. .............................. 365/230.06; 365/230.08
(58) Field of Classification Search ............ 365/185.23
See application file for complete search history.

(56) References Cited

U.S. PATENT DOCUMENTS

| | | | |
|---|---|---|---|
| 5,414,661 A | 5/1995 | Ihara | |
| 5,548,225 A | 8/1996 | Roundtree et al. | |
| 5,576,633 A | 11/1996 | Roundtree et al. | |
| 5,717,650 A * | 2/1998 | Chung et al. | 365/230.06 |
| 5,777,943 A * | 7/1998 | Kim et al. | 365/230.06 |
| 5,848,020 A * | 12/1998 | Mori | 365/230.06 |
| 5,848,024 A * | 12/1998 | Cho | 365/230.06 |
| 6,023,436 A | 2/2000 | Han | |
| 6,185,151 B1 | 2/2001 | Cho | |
| 6,259,646 B1 | 7/2001 | Huber | |
| 6,359,828 B1 | 3/2002 | La | |
| 6,513,130 B1 | 1/2003 | Cross | |
| 6,707,753 B2 | 3/2004 | Clark et al. | |
| 6,724,681 B2 | 4/2004 | Terzioglu et al. | |
| 7,009,911 B2 | 3/2006 | Morzano et al. | |

* cited by examiner

*Primary Examiner*—Tan T. Nguyen
(74) *Attorney, Agent, or Firm*—Edward L. Pencoske; Jones Day

(57) ABSTRACT

An apparatus and method for selecting a storage location in a memory device including receiving at least one of a pre-decoded location address signal, a match signal, and a redundant location address enable signal, enabling one of a decoder and a redundant decoder in response to the match signal, wherein the decoder is operable to generate a location select signal for selecting a first location, the decoder being responsive to the pre-decoded location address signal, and wherein the redundant decoder is operable to generate a redundant location select signal for selecting a second location, the redundant decoder being responsive to the redundant location address enable signal, and terminating one of the generation of a location select signal and the generation of a redundant location select signal in response to a precharge signal.

13 Claims, 9 Drawing Sheets

Address Pre-decode Example

| CA 543 | CA345 76543210 |
|---|---|
| 000 | 00000001 |
| 001 | 00000010 |
| 010 | 00000100 |
| 011 | 00001000 |
| 100 | 00010000 |
| 101 | 00100000 |
| 110 | 01000000 |
| 111 | 10000000 |

PRIOR ART - Static Decoder

PRIOR ART - Dynamic Decoder

MEMORY ARRAY DECODER

CROSS REFERENCE TO RELATED APPLICATIONS

This application is a divisional of U.S. patent application Ser. No. 11/316,377 entitled Memory Array Decoder, filed on Dec. 22, 2005, now U.S. Pat. No. 7,245,550, which is a continuation of U.S. patent application Ser. No. 10/887,616 entitled Memory Array Decoder, filed on Jul. 9, 2004, now U.S. Pat. No. 7,009,911.

BACKGROUND

The present invention relates generally to a memory array address decoder and more particularly to a memory array address decoder used by a dynamic random access memory device.

A typical DRAM memory device is comprised of a plurality of memory cells, each comprised of a transistor and a capacitor. Each memory cell stores one bit of data in the form of a voltage. A high voltage level (e.g., 3V) represents a logic "1", whereas a low voltage level (e.g., 0V) represents a logic "0". The DRAM may also include peripheral devices, such as drivers, sense amps, input/output devices, and power supplies, etc., that are used to identify memory cells, access the memory cells, and store information within and read information from the memory cells, among others.

The memory cells may be arranged in an array with each memory cell being connected to a wordline and a digitline. Each memory cell has a unique address. Typically, the DRAM's control logic receives commands (e.g., read, write, etc.) and address information from a memory system controller. The address information is decoded by row and column decoders and the specific memory cell for which the command is directed is identified and the command executed.

Most DRAMs have built-in redundancy. Thus, should a memory cell become inoperable, a redundant memory cell can be assigned to logically take its place. For DRAMs incorporating redundancy, address information is sent to a comparator circuit. If the address information corresponds to an inoperable memory cell, a match signal is generated which substitutes the memory address of a redundant cell for that of the inoperable memory cell. The generation of the match signal, however, limits the speed of the DRAM because the other circuitry within the device must wait for the match signal to be generated.

The address information supplied to the row and column decoders can be either "true and complement" or pre-decoded as is known in the art. Pre-decoded address lines, for example, may be formed by logically combining (i.e., using one or more AND logic gates) true and complement addresses. Pre-decoded addressing requires less power than true and complement addressing because fewer signals need to make transitions during address changes. Additionally, pre-decoded addressing has a higher efficiency than true and complement addressing because fewer transitions are required to decode the same number of addresses.

Typical prior art decoders are classified as static or dynamic. FIG. 8 is a schematic of a static column decoder 80 according to the prior art. The static column decoder 80 includes NOR gate 81, NAND gates 82 and 84, and inverters 83 and 85. Pre-decoded address signals CA345*i*<0> and CA67Ei<0> are input into NOR gate 81 (where the "i" indicates that the signal is active low). The output of NOR gate 81 is fed to an input of NAND gate 82 and to an input of NAND gate 84. The pre-decoded address signal CA012<1> is provided to another input of NAND gate 82, whereas the pre-decoded address signal CA012<0> is provided to another input of NAND gate 84. The output of NAND gate 82 is fed to the input of inverter 83, which outputs the column select signal CSEL<1>. The output of NAND gate 84 is fed to the input of inverter 85, which outputs the column select signal CSEL<0>.

The static column decoder 80, although simple to implement, has several deficiencies. First, different gate delays are created for each column select line because the static column decoder 80 uses CMOS gates. Although originally tolerable, the differing gate delays create problems for today's DRAMs which operate at increased speeds. Second, the static column decoder 80 requires that the turn-on period and turn-off period of a match signal, for example generated when the originally addressed cell is found to be inoperable, be equal (i.e., the rise and fall times of the match signal must be the same). Thus, the cycle time for a static column decoder 80 is adversely affected.

FIG. 9 is a schematic of a dynamic column decoder 90 according to the prior art. The dynamic column decoder 90 includes several p-mos transistors (M2, M4, M6), several n-mos transistors (M1, M3, M5, M7), and several inverters (91-96). Typically, the dynamic column decoder is operated by first applying a precharge signal to the gates of transistors M3 and M7, thus pulling nodes 98 and 99, respectively, to ground. The precharge signal is then removed from the gates of transistors M3 and M7. Inverter 91 is used to latch node 98 at ground (thus, preventing node 98 from floating when the precharge signal is removed from the gate of transistor M3). Likewise, inverter 94 is used to latch node 99 at ground (thus, preventing node 99 from floating when the precharge signal is removed from the gate of transistor M7).

After the precharge signal is removed, the pre-decoded address signals CA012*i*<1>, CA012*i*<0>, CA345*i*<0>, and CA67E<0> are applied to the dynamic column decoder 90. The state of each of the output signals CSEL<1> and CSEL<0> is dependent upon these pre-decoded signals as should be apparent to one skilled in the art.

One advantage of the dynamic column decoder 90 over the static column decoder 80 is that the dynamic column decoder has consistent gate delays. Thus, the column select output lines (i.e., signals CSEL<1> and CSEL<0>) have consistent on/off times. The dynamic column decoder 90, however, has several deficiencies. For example, the feedback inverters 91, 94 must be sized large enough to keep the nodes 98 and 99, respectively, from floating (i.e., must keep the nodes 98 and 99 at ground potential, set when the precharge signal goes active), but sized small enough to be easily overridden when the pre-decoded address signals CA012*i*, CA345*i*, and CA67E go active. Additionally, the pre-decoded address signals CA012*i*, CA345*i*, and CA67E cannot go active until the precharge signal goes inactive, else the pre-decoded address signals overlap and fight the precharge signal. If the precharge and pre-decoded address signals CA012*i*, CA345*i*, and CA67E overlap, the turn on timing of the dynamic column decoder is adversely affected. Thus, the precharge signal consumes a relatively large amount of the cycle time which is available for providing the column select signals.

Thus, there exists a need for an improved memory array decoder that has a consistent turn-on time, that can utilize a precharge signal without adversely affecting the cycle time, and which overcomes the other limitations inherent in prior art.

SUMMARY

One aspect of the invention relates to a method for selecting a storage location in a memory device. The method comprises receiving at least one of a pre-decoded location address signal, a match signal, and a redundant location address enable signal, enabling one of a decoder and a redundant decoder in response to the match signal, wherein the decoder is operable to generate a location select signal for selecting a first location, the decoder being responsive to the pre-decoded location address signal, and wherein the redundant decoder is operable to generate a redundant location select signal for selecting a second location, the redundant decoder being responsive to the redundant location address enable signal, and terminating one of the generation of a location select signal and the generation of a redundant location select signal in response to a precharge signal.

Another aspect of the invention relates to a method for selecting a storage location in a memory device comprising enabling a decoder in response to at least one of an address signal and a match signal, generating a location select signal with the enabled decoder, and terminating the generating of the location select signal in response to the address signal and a precharge signal.

Another aspect of the invention relates to a method for accessing a memory location. The method comprises enabling one of a decoder circuit and a redundant decoder circuit in response to at least one of a pre-decoded address signal, a redundant column select enable signal, and a match signal, generating one of a column select signal with the enabled decoder circuit and a redundant column select signal with the enabled redundant decoder circuit, and terminating the generating of one of the column select signal and the redundant column select signal in response to a precharge signal and at least one of the pre-decoded address signal and the redundant column select enable signal.

Another aspect of the invention relates to a decoder, comprising an input for receiving a first signal, a first node connected to the input via an enabling device which is responsive to a second signal, a plurality of inverters for generating a location select signal in response to the first and second signals, and a feedback loop responsive to the location select signal, the feedback loop supplying at least one of a precharge signal and a latch signal to the first node.

Another aspect of the invention relates to a column address circuit for a memory device comprising a command decode circuit operable to generate a precharge signal, an address trap circuit responsive to the command decode circuit to convert an address signal into a column address signal, a redundancy compare circuit responsive to the command decode circuit and the address trap circuit to generate a match signal and a redundant column select enable signal, an address pre-decode circuit responsive to the command decode circuit, the address trap circuit, and the redundancy compare circuit to generate a pre-decoded column address signal in response to the column address signal, and a decoder circuit operable to generate at least one of a column select signal in response to the pre-decoded column address signal and a redundant column select signal in response to the redundant column select enable signal, the decoder circuit further responsive to the precharge signal to terminate the generation of one of the column select signal and the redundant column select signal.

Another aspect of the invention relates to a memory device comprising a memory array having a plurality of memory cells, a plurality of wordlines and a plurality of digitlines, wherein the memory cells are accessible by the wordlines and the digitlines, and a plurality of peripheral devices for reading data out of and writing data into the memory array. The peripheral devices comprise a digitline driver for activating at least one of the digitlines, the digitline driver responsive to a decoder output signal, and a decoder for providing the decoder output signal, wherein the decoder comprises an input for receiving a first signal, a first node connected to the input via an enabling device which is responsive to a second signal, a plurality of inverters for generating the decoder output signal in response to the first and second signals, and a feedback loop responsive to the decoder output signal, the feedback loop supplying at least one of a precharge signal and a latch signal to the first node.

BRIEF DESCRIPTION OF THE DRAWINGS

To enable the present invention to be easily understood and readily practiced, the present invention will now be described for purposes of illustration and not limitation, in connection with the following figures wherein.

DETAILED DESCRIPTION

Figure 1:
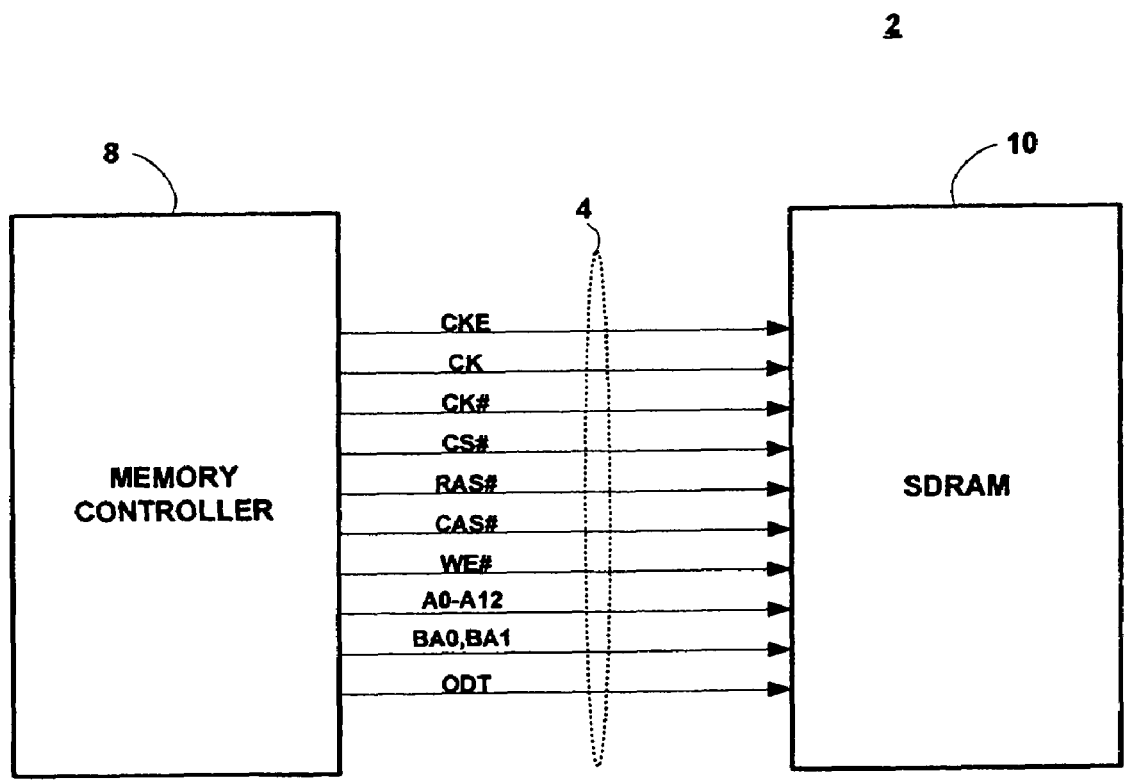
FIG. 1 is a simplified block diagram of a memory system according to one embodiment.

FIG. 1 is a simplified block diagram of a memory system 2 according to one embodiment. The memory system 2 includes a memory controller 8 and a synchronous dynamic random access memory (SDRAM) 10. The use of an SDRAM is for exemplary purposes only and is not intended, in any manner, to limit the scope of the present invention. It should be apparent to those skilled in the art that other types of memory devices may be used while remaining within the scope of the present invention. For example, a pseudo-static dynamic random access memory (PSDRAM), a double data rate dynamic random access memory (DDR DRAM), an extended data out dynamic random access memory (ED0 DRAM), etc. may be used.

Additionally, it should be apparent to those skilled in the art that the memory system 2 may include other components while remaining within the scope of the present invention. For example, memory system 2 may include a microprocessor, micro-controller, ASIC, etc. which is in communication with the memory controller 8 and the synchronous dynamic random access memory (SDRAM) 10.

The memory controller 8 and SDRAM 10 communicate via a system bus 4. In the current embodiment, the system bus 4 carries command signals, address signals, and data signals, among others. The system bus 4 may be sub-divided into two or more buses, for example a command bus 12 (not shown in FIG. 1), an address bus 16 (not shown in FIG. 1), and a data bus 37 (not shown in FIG. 1). The command bus may carry the row address strobe (RAS#), column address strobe (CAS#), and write enable (WE#) command signals, among others. The address bus may carry bank address (BA0, BA1) and address input (A0-A12) signals, among others. The data bus may carry data input/output signals (DQ0-DQ15), data strobe signals (LDQS, LDQS#, UDQS, UDQS#), and data mask signals (LDM, UDM), among others. Additionally, some command signals, such as the chip select (CS#), clock enable (CKE), and on-die termination (ODT) signals may be carried by another portion of the system bus 4. It should be apparent to one skilled in the art that the topology of the system bus 4 (and its component parts) may be varied while remaining within the scope of the present invention. It should further be apparent to one skilled in the art that the illustrated signals are for exemplary purposes only and not intended to limit the present invention in any manner.

Figure 2:
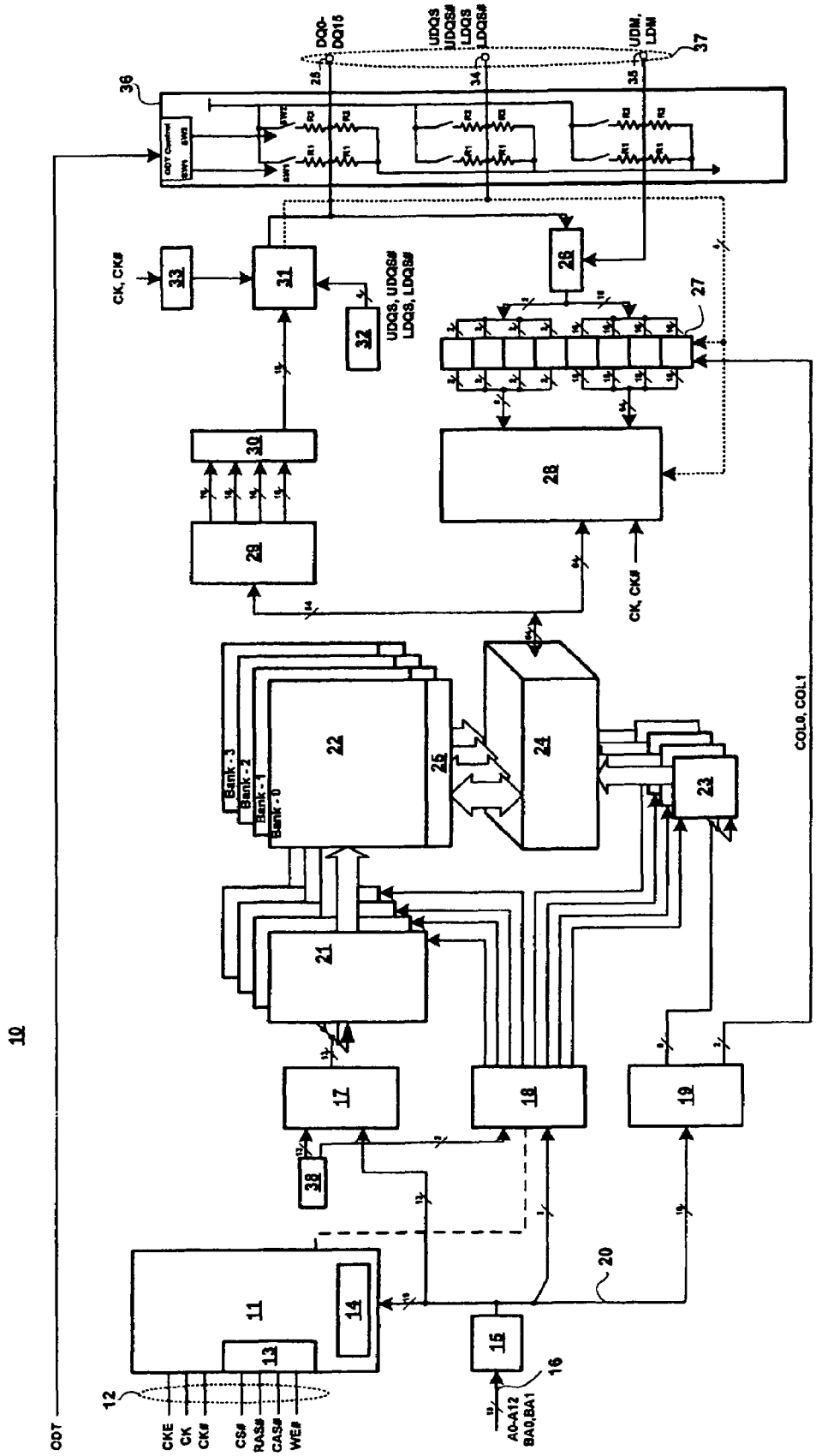
FIG. 2 illustrates a simplified functional block diagram of an architecture for the memory device of FIG. 1 according to one embodiment.

FIG. 2 illustrates a simplified functional block diagram of an architecture for the SDRAM 10 of FIG. 1 according to one embodiment. The SDRAM 10 includes a control logic 11 responsive to a plurality of command signals (e.g., CS#, RAS#, CAS#, WE#, CKE, CK, CK#, ADR, BA, etc.) from a command bus 12. The control logic 11 includes a command decode circuit 13 and mode register circuits 14, among others. Table 1 illustrates a truth table for the command coding of the SDRAM 10 according to the current embodiment.

TABLE 1

SDRAM Coding Truth Table
(L = 0, active; H = 1, inactive).

| | CKE | | | | | |
| --- | --- | --- | --- | --- | --- | --- |
| FUNCTION | Previous Cylcle | Current Cycle | CS# | RAS# | CAS# | WE# |
| Write | H | H | L | H | L | L |
| Read | H | H | L | H | L | H |
| Bank Activate | H | H | L | L | H | H |
| Load Mode | H | H | L | L | L | L |
| Refresh | H | H | L | L | L | H |
| Self-Refresh Entry | H | L | L | L | L | H |
| Self-Refresh Exit | L | H | H | X | X | X |
| | | | L | H | H | H |
| Precharge | H | H | L | L | H | L |
| No Operation | H | X | L | H | H | H |

Referring to Table 1 for example, when the memory controller 8 sets CS#=L, RAS#=H, CAS#=L and WE#=L, the command decode circuit 13 decodes the signals as a write command function. It should be apparent to those skilled in the art that different and/or additional signals (e.g., BA, ADR, etc.) may be used to encode each command function.

It should further be apparent to one skilled in the art that the specific state of each command signal (i.e., CS#, RAS#, etc.) used to define each command function (i.e., write, read, etc.) may be altered while remaining within the scope of the present invention.

The SDRAM 10 also includes an address register 15 responsive to an address bus 16 which carries a plurality of address signals (e.g., A0-A12, BA0, BA1, etc.). The control logic 11 and the address register 15 communicate with each other, and with a row address multiplexer circuit 17, a bank control logic circuit 18, and a column address counter/latch circuit 19, via an internal bus 20.

The bank control logic 18 is responsive to the control logic 11, the address register 15, and a refresh counter 38. The row address multiplexer 17 is also responsive to the control logic 11, the address register 15, and the refresh counter 38. A series of row latch/decoders 21 are responsive to the bank control logic 18 and the row address multiplexer 17. One row latch/decoder 21 is provided for each memory array 22. Each memory array 22 is comprised of a plurality of memory cells each operable to store one bit of information. Four memory arrays 22, labeled bank 0 through bank 3, are illustrated in FIG. 2. Accordingly, there are four row latch/decoder circuits 21, one each for controlling bank 0 through bank 3.

The column address counter/latch circuit 19 is responsive to the control logic 11 and the address register 15. A series of column decoders 23 are responsive to the bank control logic 18 and the column address counter/latch 19. One column decoder 23 is provided for each memory array 22. As discussed above, SDRAM 10 includes four memory arrays 22 labeled bank 0 through bank 3. Accordingly, there are four column decoder circuits 23, one each for controlling bank 0 through bank 3. An I/O gating circuit 24 is responsive to the column decoder circuits 23 for controlling sense amplifiers 25 within each of the memory arrays 22.

The SDRAM 10 may be accessed through a plurality of data pads 25 for either a write operation or a read operation. For a write operation, data on data pads 25 is received by receivers 26 and passed to input registers 27. A write buffer/driver circuit 28 buffers the received data which is then input to the memory arrays 22 through the I/O gating circuit 24.

Data which is to be read from the memory arrays 22 is output through the I/O gating circuit 24 to a read latch 29. From the read latch 29, the information is input to a multiplexer circuit 30 which outputs the data onto the data pads 25 through drivers 31. The drivers 31 are responsive to a data strobe generator 32 and to a delay locked loop circuit 33. The data strobe generator 32 is operable to produce data strobes for upper and lower bytes (i.e., UDQS, UDQS#, LDQS, and LDQS#) as is known in the art. The data strobes are also provided to data strobe output pads 34, input registers 27, and to the write buffer/driver 28, among others. The SDRAM 10 also includes input data mask pads 35 for receiving upper data mask signals (UDM) and lower data mask signals (LDM) for the upper bytes (DQ8-DQ15) and lower bytes (DQ0-DQ7), respectively. The data pads 25, data strobe output pads 34, and data mask pads 35 may be part of a data bus 37.

The SDRAM 10 includes an on-die termination (ODT) circuit 36 which is operable to apply an effective resistance Rtt (e.g., R1 or R2) to the data pads 25, data strobe output pads 34, and input data mask pads 35 (or to another portion of the data bus). The memory controller 8 may issue an ODT control signal for enabling/disabling the ODT circuit 36. Those of ordinary skill in the art with recognize that the diagram of FIG. 2 has been simplified so as to focus on those elements which are helpful to understand the present invention while eliminating other elements not needed to understand the present invention.

Figure 3:
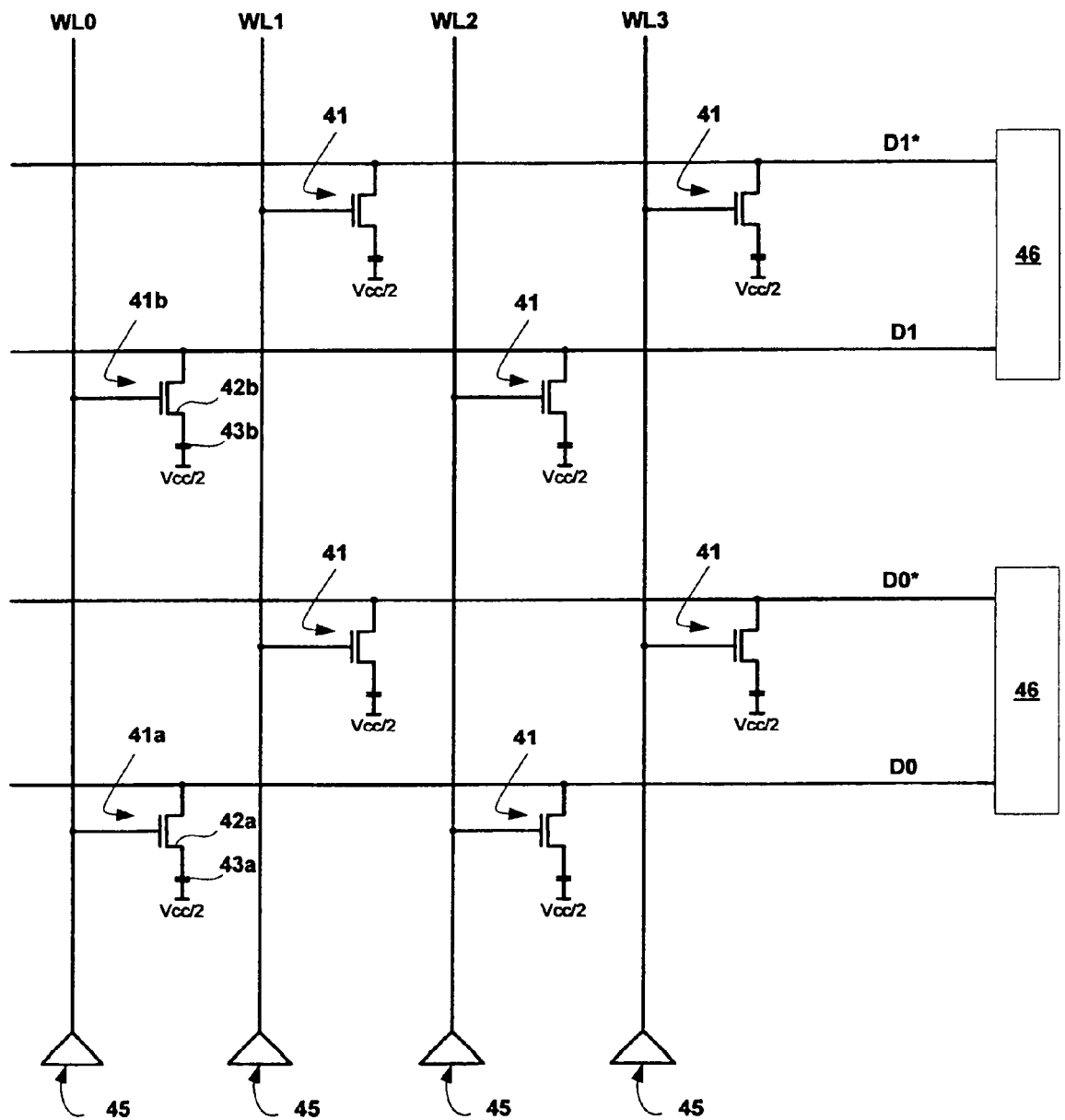
FIG. 3 is a simplified schematic of one bank of the memory array of FIG. 2.

FIG. 3 is a simplified schematic of one bank of the memory array 22 of FIG. 2. The memory array 22, as illustrated, may be referred to as a folded digitline array, however, it should be apparent to those skilled in the art that other DRAM architectures (for example, an open digitline DRAM memory array) may be used while remaining within the scope of the present invention.

The array 22 is comprised of a plurality of memory cells or memory bits (mbit) 41, each of which includes a mbit transistor 42 and a storage capacitor 43. The mbits 41 are capable of holding binary information in the form of stored charge on their capacitors 43. The mbit transistors 42 operate as a switch interposed between the mbit capacitors 43 and their associated digitlines (e.g., D0, D0*, D1, D1*). The mbit transistors 42 are operated (i.e., activated/deactivated) using signals supplied on an associated wordline (e.g., WL0, WL1, WL2, WL3) via wordline drivers 45.

Accessing an mbit 41 results in charge sharing between the accessed mbit capacitor 43 and its corresponding digitline (e.g., D0, D0*, D1, D1*). If the accessed mbit capacitor 43 contains a stored logic one (e.g., Vcc), the charge between the capacitor and the digitline causes the voltage on the corresponding digitline (e.g., D0, D0*, D1, D1*) to increase. If the accessed mbit capacitor 43 contains a stored logic zero (e.g., 0V), the charge sharing causes the voltage on the corresponding digitline (e.g., D0, D0*, D1, D1*) to decrease. This is true because the digitlines are precharged to Vcc/2 prior to the array access operation. It should be apparent to one skilled in the art that the size of the array 22 illustrated in FIG. 3 (i.e., with eight mbits 41, four wordlines WL0, WL1, WL2, WL3, and four digitlines (D0, D0*, D1, D1*) is used for exemplary purposes and that arrays having a different size and layout are within the scope of the present invention.

Figure 4:
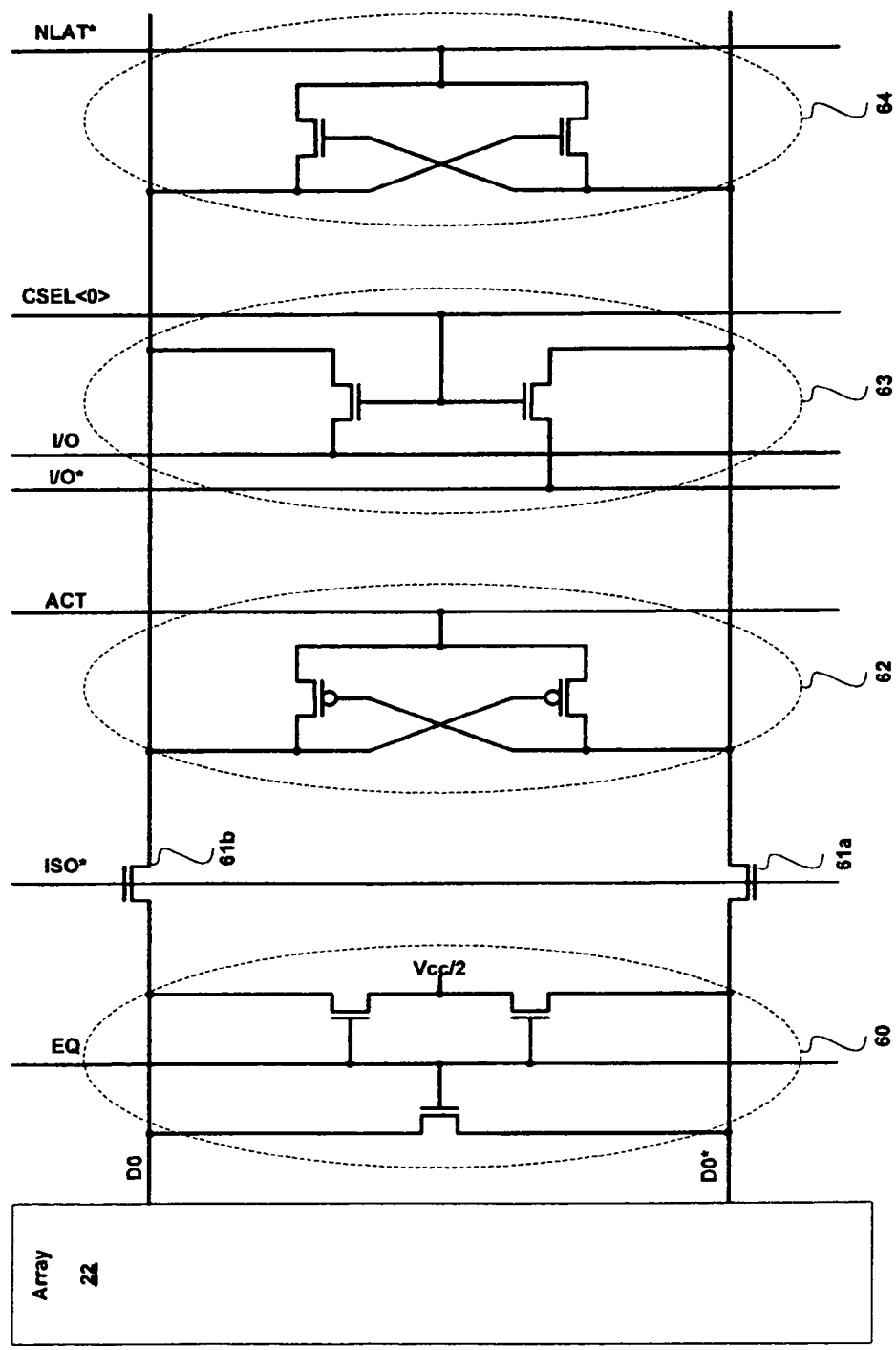
FIG. 4 is a simplified schematic of a plurality of peripheral devices that may be used with the memory device of FIG. 3.

The digitlines (D0, D0*, D1, D1*) may be grouped into digitline pairs (D0-D0*, D1-D1*) and connected to peripheral devices 46. The peripheral devices 46 may be used, for example, to determine whether the charge stored in the accessed mbit 41 was a logic one or a logic zero. FIG. 4 is a simplified schematic illustrating some of the peripheral devices 46 that may be used with the array 22 of FIG. 3. The peripheral devices include an equalization circuit 60, isolations transistors (61a, 61b), a p-sense amplifier 62, an input/output (I/O) circuit 63, and an n-sense amplifier 64, each of which spans the digitline pair D0-D0*.

The equalization circuit 60 is responsive to an equalization signal (EQ) and is operable to drive the digitlines D0 and D0* to a common voltage potential. The isolation transistors (61a, 61B) are responsive to an isolation signal (ISO*) and are operable to isolate the array 22 from one or more of the peripheral devices and from other arrays that may be connected to the digitlines D0 and D0*. The p-sense amplifier 62 (responsive to activation signal ACT) and the n-sense amplifier 64 (responsive to n-latch signal NLAT*) are operable to sense the charge stored within the mbit 41 that is accessed by the wordline driver 45 as discussed in conjunction with FIG. 3. The I/O circuit 63 is responsive to a column select signal (CSEL) and is operable to connect the digitlines D0 and D0* to the input/output lines I/O and I/O*, respectively. It should be apparent to one skilled in the art that other peripheral devices may be used while remaining within the scope of the present invention and that each digitline pair may include its own group of peripheral devices 46.

Figure 5A:
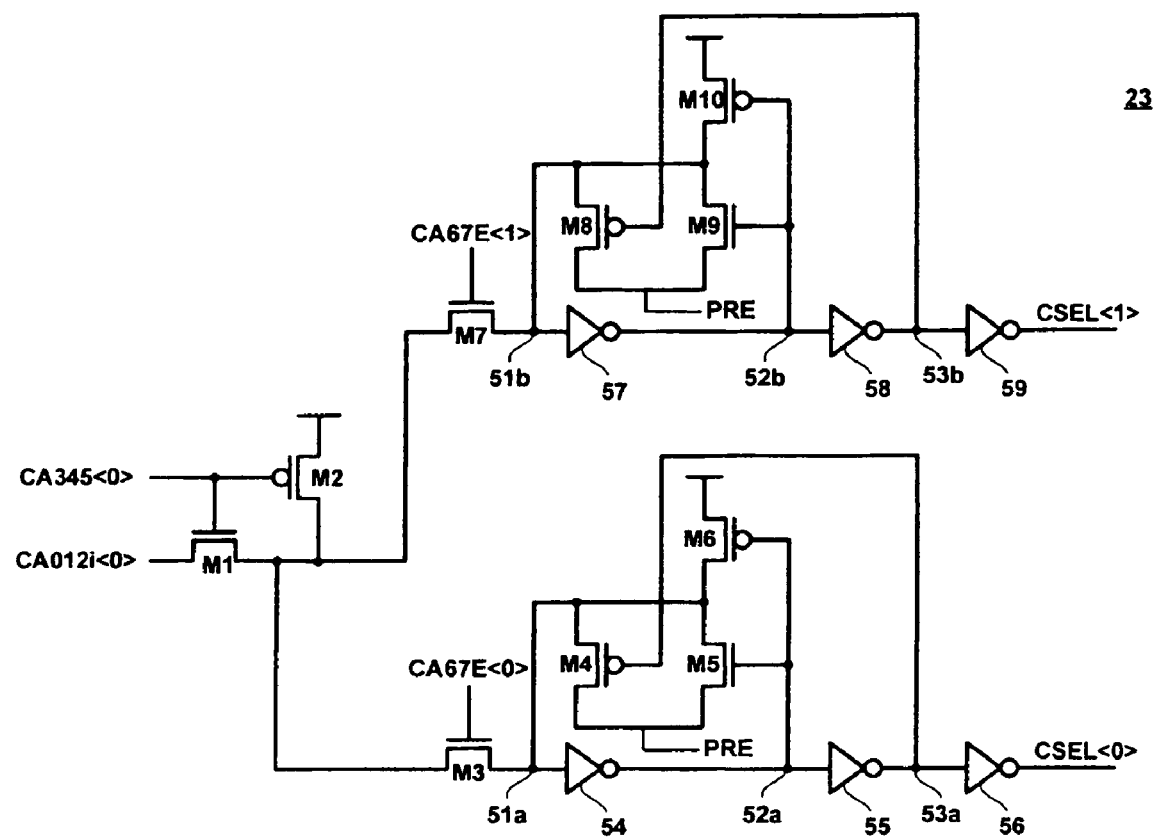
FIG. 5A is a schematic of an column decoder circuit according to one embodiment.

FIG. 5A is a schematic of an column decoder circuit 23 according to one embodiment. The column decoder circuit 23 is operable to produce one or more column select signals (CSEL), for example, used by the I/O circuits 63 of FIG. 4. As illustrated in FIG. 5A, the column decoder circuit 23 is operable to produce column select signals CSEL<0> (which in the current embodiment may be used to activate the I/O circuit 63 for digitline pair D0-D0*) and CSEL<1> (which in the current embodiment may be used to activate the I/O circuit for digitline pair D1-D1*).

In the current embodiment, the decoder circuit 23 is employed to generate a column select signal which is used for selecting a storage location (e.g., a mbit) in a memory device. It should be apparent to one skilled in the art, however, that the decoder circuit 23 may be used for applications other than for producing a column select signal. The current embodiment is in no way intended to limit the scope of the present invention.

In the current embodiment, the column decoder circuit 23 is responsive to pre-decoded signals CA012i<0>, CA345<0>, CA67E<0>, and CA67E<1>. Specifically, CA345<0> is fed to gates of transistors M1 and M2 and CA012i<0> is fed to the source of transistor M1. The drains of transistors M1 and M2 are connected to the source of transistor M3 and to the source of transistor M7. The pre-decoded address signal CA67E<0> is fed to the gate of transistor M3 and the pre-decoded address signal CA67E<1> is fed to the gate of transistor M7.

The drain of transistor M3 is connected to node 51a, which is also connected to the input of inverter 54, to the source of transistor M4, and to the drains of transistors M5 and M6. The output of inverter 54 is connected to node 52a, which is also connected to the input of inverter 55 and to the gates of transistors M5 and M6. The source of transistor M6 is connected to Vcc. The source of transistor M5, which carries the precharge signal, is connected to the drain of transistor M4. The output of inverter 55 is connected to node 53a, which is also connected to the input of inverter 56 and is fed back to the gate of transistor M4. The output of inverter 56 provides the signal CSEL<0>. In the current embodiment, transistor M6 may be a very weak device (e.g., has a small channel) such that it may easily be overridden when transistor M3 is turned on.

The drain of transistor M7 is connected to node 51b, which is also connected to the input of inverter 57, to the source of transistor M8, and to the drains of transistors M9 and M10. The output of inverter 57 is connected to node 52b, which is also connected to the input of inverter 58 and to the gates of transistors M9 and M10. The source of transistor M10 is connected to Vcc. The source of transistor M9, which carries the precharge signal, is connected to the drain of transistor M8. The output of inverter 58 is connected to node 53b, which is also connected to the input of inverter 59 and is fed back to the gate of transistor M8. The output of inverter 59 provides the signal CSEL<1>. In the current embodiment, transistor M10 may be a very weak device (e.g., has a small channel) such that it may easily be overridden when transistor M7 turns on.

Referring to FIG. 5A, it should be apparent to one skilled in the art that the pre-decoded signals CA67E<0> and CA67E<1> act as enabling signals for CSEL<0> and CSEL<1>, respectively. It should further be apparent to one skilled in the art that transistors M4, M5 and transistors M8, M9 are enabled (and thus the precharge signal is applied) only when the column select lines CSEL<0> and CSEL<1>, respectively, are already on.

Referring to the CSEL<0> portion of column decoder circuit 23 for example, assume that CSEL<0> is low. Then, node 51a is high, node 52a is low, and node 53a is high. In this case, transistor M4 is disabled (i.e., because node 53a is high), transistor M5 is disabled, and transistor M6 is enabled (i.e., because node 52a is low). Thus, node 51a is latched at Vcc by transistor M6 and the precharge signal is not applied to node 51a. As discussed above, transistor M6 may be a very weak device such that it may easily be overridden when transistor M3 turns on.

In contrast, assume that CSEL<0> is high. Then, node 51a is low, node 52a is high, and node 53a is low. In this case, transistor M4 is enabled (i.e., because node 53a is low), transistor M5 is enabled, and transistor M6 is disabled (i.e., because node 52a is high). The precharge signal is applied to node 51a through transistors M4 and M5. Accordingly, the precharge signal (PRE) can only precharge a column select line that is currently turned on. Thus, any overlap between of the precharge signals (PRE) and the enable signal CA67E<0> does not effect the turn on time of the column decoder 23 and does not effect the percent of the cycle time that the decode is on.

Figure 5B:
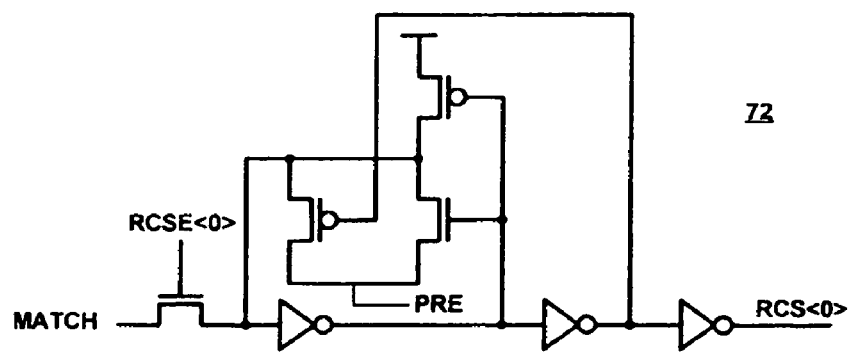
FIG. 5B is a schematic of a redundant column decoder circuit according to one embodiment.

FIG. 5B is a schematic of a redundant column decoder circuit 72 according to one embodiment. The redundant column decoder circuit 72 functions in a similar manner as that of the column decoder 23. In the current embodiment, the redundant column decoder circuit 72 is responsive to the MATCH signal and the redundant column select signal RCSE<0>. It should be apparent to one skilled in the art that the redundant column select signal RCSE<0> acts as enabling signal for RCS<0>.

Figures 6A, 6B:
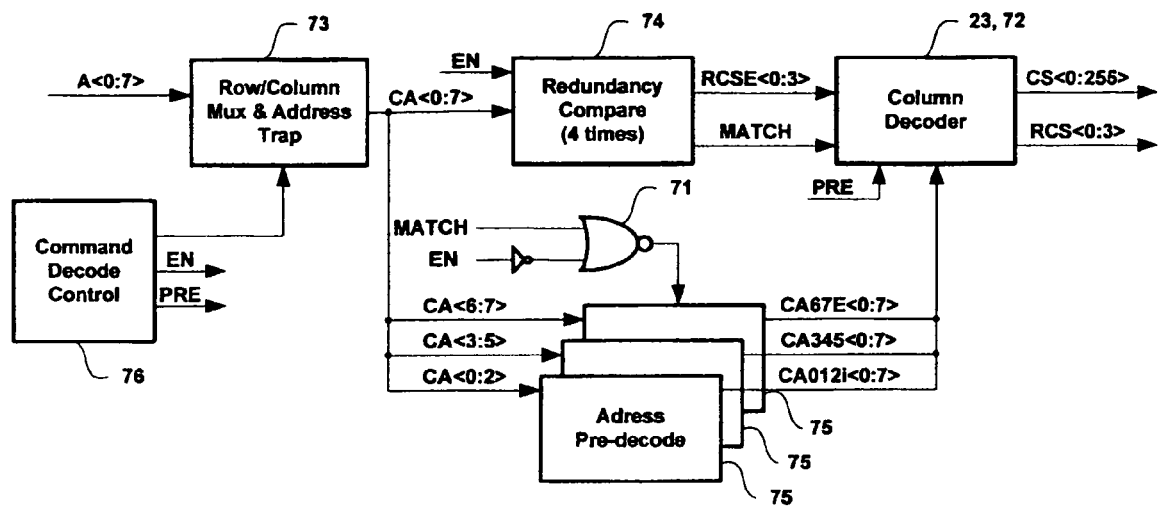
FIG. 6A is a simplified schematic of a column address circuit incorporating the column decoder circuit of FIG. 5A and the redundant column decoder circuit of FIG. 5B according to one embodiment.
FIG. 6B is a table illustrating an address pre-decode scheme for column address signal according to one embodiment.

FIG. 6A is a simplified schematic of a column address circuit 70 incorporating one or more column decoder circuits 23 of FIG. 5A and/or one or more redundant column decoder circuits of FIG. 5B according to one embodiment. The column addressing circuit 70 includes a row/column multiplexer & address trap 73, a redundancy compare circuit 74, a column decoder 23, a redundant column decoder 72, address pre-decode circuits 75, and a command decode control circuit 76. The row/column multiplexer & address trap 73 receives a command decode signal from the command decode control circuit 76 and address signals (for example, address signals A<0:7> from address bus 16). The row/column multiplexer & address trap 73 outputs one or more column address signals (e.g., CA<0:7>). The column address signals are supplied to redundancy compare circuit 74 and to the address pre-decode circuits 75.

The address pre-decode circuit 75 uses column address signals CA<0:2>, CA<3:5>, and CA<6:7> to produce pre-decoded address signals CA67E<0:7>, CA345<0:7>, and CA012i<0:7> which are input into the column decoder 23. The column decoder 23 produces column select signals CS<0:255>.

FIG. 6B is a table illustrating an address pre-decode scheme for column address signals according to one embodiment. More specifically, the table in FIG. 6B illustrates an address pre-decode scheme for the column address signal CA<3:5>. For example in the current embodiment, when CA<3:5> is equal to 000 (i.e., column address bits 5, 4, and 3 are at states 0, 0, and 0, respectively), the address pre-decoder circuit 75 outputs pre-decoded address signals CA345<7>=0, CA345<6>=0, CA345<5>=0, CA345<4>=0, CA345<3>=0, CA345<2>=0, CA345<1>=0, CA345<0>=1 (i.e., bits 7 through 0 are at states 0, 0, 0, 0, 0, 0, 0, and 1, respectively). As a further example, when CA<3:5> is equal to 001 (i.e., column address bits 5, 4, and 3 are at states 0, 0, and 1, respectively), the address pre-decoder circuit 75 outputs pre-decoded address signals CA345<7>=0, CA345<6>=0, CA345<5>=0, CA345<4>=0, CA345<3>=0, CA345<2>=0, CA345<1>=1, CA345<0>=0 (i.e., bits 7 through 0 are at states 0, 0, 0, 0, 0, 1, and 0, respectively), etc. It should be apparent to one skilled in the art that other address pre-decode schemes may be used while remaining within the scope of the present invention.

Returning to FIG. 6A, the column address signals (CA<0:7>) are also supplied to redundancy compare circuit 74. The redundancy compare circuit 74 produces one or more redundancy column select enable signals (e.g., RCSE<0:3>) and a MATCH signal. The redundancy column select enable signals and the MATCH signal are supplied to one or more redundant column decoders 72. The redundant column decoders 72 produce redundant column select signals (e.g., RCS<0:3>). Typically, a single redundant column decoder 72 or column decoder 23 is enabled for a specific address. However, it should be apparent to one skilled in the art that multiple redundant column decoders 72 and/or column decoders 23 may be simultaneously activated for multiple addresses (i.e., one redundant column decoder 72 or one column decoder 23 for each of the multiple addresses).

The MATCH signal is also supplied, with the enable signal EN, to a NOR gate 71. The output of the NOR gate 71 is sent to each of the address pre-decode circuit 75 to deactivate the address pre-decode circuits when the supplied address corresponds to a defective address.

Figure 6C:
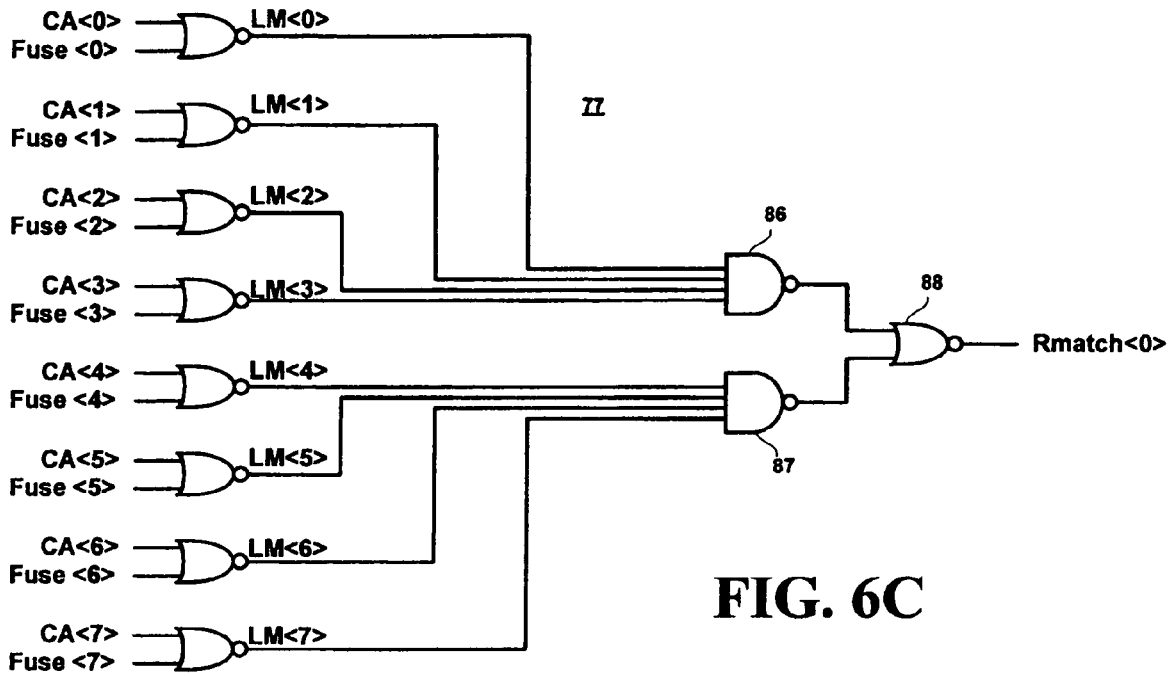
FIGS. 6C-6E illustrate exemplary the internal components of the redundancy compare circuit as shown in FIG. 6A according to one embodiment.
Figure 6D:
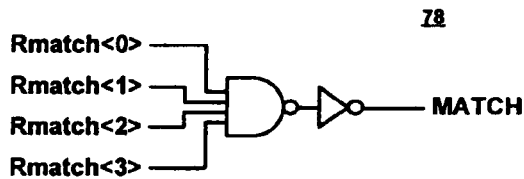
Figure 6E:

FIGS. 6C-6E illustrate exemplary internal components of the redundancy compare circuit 74 as shown in FIG. 6A according to one embodiment. As illustrated in FIG. 6C, each column address signal (e.g., CA<0:7>) is input into an exclusive-NOR gate with a fuse signal (e.g., Fuse<0:7>). Fused circuits may be used to produce the fuse signal. The fused circuits may be pre-programmed to indicate a defective address. A first group of output signals from the exclusive-NOR gates (i.e., LM<0:3>) are input into a first NAND gate 86, whereas a second group of output signals from the exclusive NOR-gates (i.e., LM<4:7>) are input into a second NAND gate 87. The output of the first NAND gate 86 and the second NAND gate 87 are input into a NOR gate 88, the output of which is a redundancy match signal (e.g., Rmatch<0>).

Several redundancy match signals may be combined to produce the MATCH signal. Referring to FIG. 6D, for example, the redundancy match signals Rmatch<0> through Rmatch<3> are combined by circuit 78 to produce the MATCH signal in one embodiment.

A redundant match signal may also be combined with the enable signal EN to produce the redundant column select enable signal (e.g., RCSE<0:3>). Referring to FIG. 6E, for example, the redundant match signal Rmatch<0> is combined with the enable signal EN by circuit 79 to produce the redundant column select enable signal RCSE<0> in one embodiment.

Figure 7:
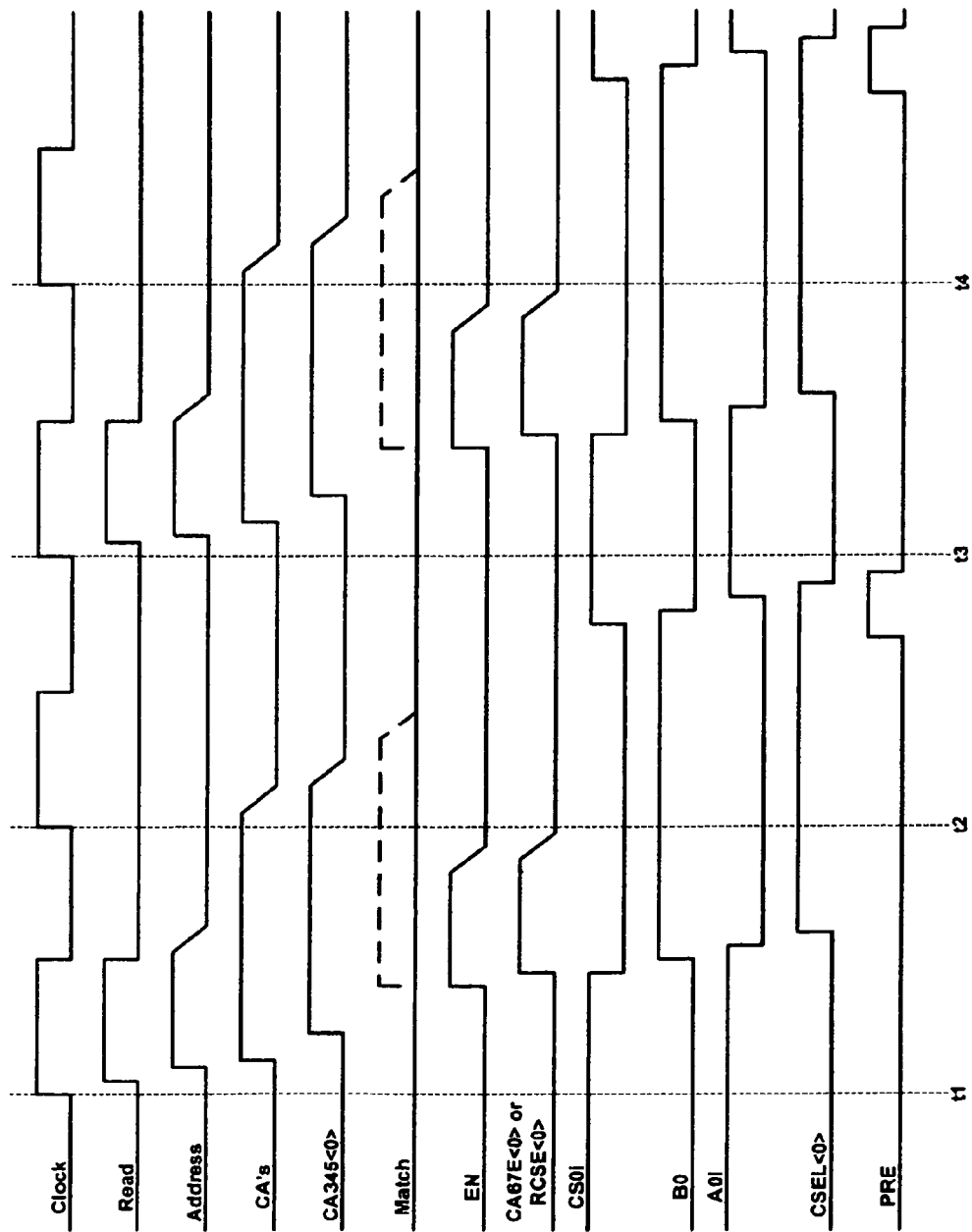
FIG. 7 illustrates a timing diagram of the column address circuit of FIG. 6A according to one embodiment.
Figure 8:
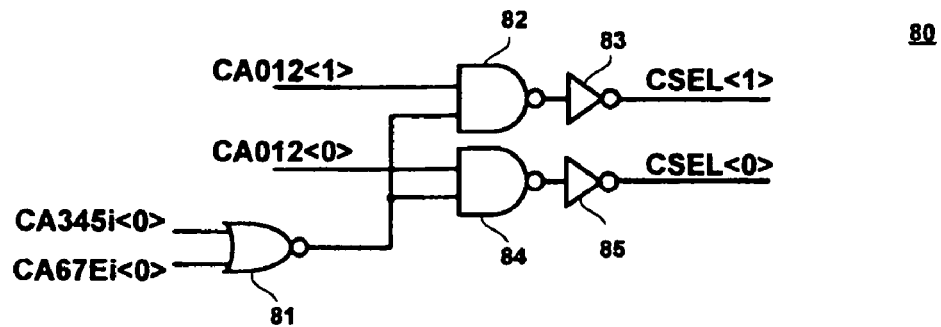
FIG. 8 is a schematic of a static array decoder according to the prior art.
Figure 9:
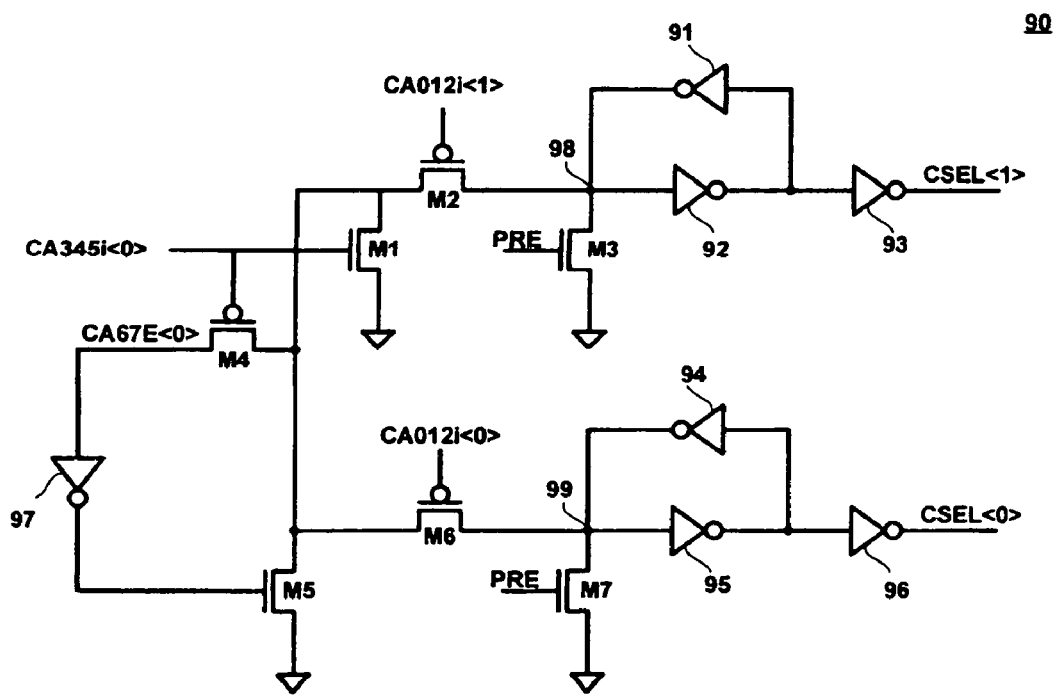
FIG. 9 is a schematic of a dynamic array decoder according to the prior art.

FIG. 7 illustrates a timing diagram for the column address circuit 70 of FIG. 6A according to one embodiment. The timing diagram of FIG. 7 shows two (2) read cycles; the first beginning at $t_1$ the second beginning at $t_3$. Referring now to the first read cycle (i.e., beginning at $t_1$), the clock signal goes active and the row/column mux and address trap 73 "traps" both a read command (i.e., present on the command decode line) and addresses (i.e., present on the address input, e.g., A<0:7>). The row/column mux and address trap 73 drives column addresses (i.e., CA<0:2>, CA<3:5>, and CA<6:7>) to the address pre-decode circuit 75 and to the redundancy compare circuit 74. The address pre-decode circuit 75 drives the pre-decoded signal CA345<0:7> to the column decoder 23.

The redundancy compare circuit 74 compares the column addresses to pre-programmed addresses representing the defective addresses in the array. If the column select corresponds to a specific column address that is defective, the redundancy compare circuit 74 finds a match. The redundancy compare circuit will then produce a redundant column addresses (RCSE<0:3>) and a MATCH signal. The MATCH signal acts as an enable signal for the redundant column decoder 72 (which produces the redundant column select signals RCS<0:3>) and disables the appropriate address pre-decode circuits 75. If the redundancy compare circuit 74 does not find a match, then the normal column select enable (EN) signal fires and the address pre-decode circuit 75 drives the pre-decoded addresses (i.e., CA012$i$<0:7>, CA345<0:7>, and CA67E<0:7>) to the column decoder 23.

As illustrated in FIG. 7, the redundancy compare circuit 74 is shown as not finding a match. A dotted MATCH signal, however, is shown to illustrate that enable signal EN fires at the same time that the MATCH signal would have fired had the address been defective.

The MATCH and EN signals cause the pre-decode signals CA67E<0:7> and the column select signal CS0$i$ to go active. Then, the bank address signal (B0), the address signal A0$i$, and the column select signal CSEL<0> each go active. The precharge signal (PRE) shuts off the column select signal CSEL<0> at the end of a cycle (as illustrated in FIG. 7, the read cycle uses two clock pulses).

It should be noted that the sloped lines in FIG. 7 are used to illustrate that the corresponding signals can be skewed so as to have fast turn-on times and slow turn-off times (e.g., to improve speed over static decoders that must match turn-on/turn-off times). Additionally, it should be noted that the column array circuit 70 uses four (4) redundant elements. The MATCH signal fires if any of the four redundancy compare circuits finds a match. It should be apparent to one skilled in the art that the redundant column select signal (e.g., RCSE<0>) is activated instead of a column enable signal (e.g., CA67E<0>) when a match is found by the redundancy compare circuit 74.

It should be recognized that the above-described embodiments of the invention are intended to be illustrative only. Numerous alternative embodiments may be devised by those skilled in the art without departing from the scope of the following claims. For example, the scope of the present invention may extend to other types of circuits and should not be limited solely to column address decoders.

What is claimed is:

1. A column decoder for a memory device, comprising:
   an input for receiving a plurality of pre-decoded address signals;
   a first node connected to said input via an enabling device which is responsive to another pre-decoded address signal;
   a plurality of series connected inverters connected to said first node for generating a column select signal; and
   a plurality of transistors interconnected so as to supply one of a precharge signal and a fixed voltage to said first node in response to said column select signal.

2. The decoder of claim 1 wherein said plurality of series connected inverters comprises:
   a first inverter having an input connected to said first node and an output connected to a second node;
   a second inverter having an input connected to said second node and an output connected to a third node; and
   a third inverter having an input connected to said third node and an output carrying said column select signal.

3. The decoder of claim 2 wherein said plurality of transistors comprises:
   a first transistor having a gate terminal connected to said third node, said first transistor operable to supply said precharge signal to said first node;
   a second transistor having a gate terminal connected to said second node, said second transistor operable to supply said precharge signal to said first node; and
   a third transistor having a gate terminal connected to said second node, said third transistor operable to supply said fixed voltage to said first node.

4. The decoder of claim 3 wherein said third transistor is sized to be overridden when said enabling device is conductive.

5. The decoder of claim 3 wherein one of said first and said second transistors is a p-type transistor, and the other of said first and said second transistors is an n-type transistor.

6. The decoder of claim 3 wherein one of said second and third transistors is a p-type transistor, and the other of said second and third transistors is an n-type transistor.

7. A column decoder for a memory device, comprising:
   an input for receiving a plurality of pre-decoded address signals;
   a first signal path comprising a first node connected to said input via an enabling device which is responsive to another pre-decoded address signal; a plurality of series connected inverters connected to said first node for generating a column select signal; and a plurality of transistors interconnected so as to supply one of a precharge signal and a fixed voltage to said first node in response to said column select signal; and
   a second signal path comprising a first node connected to said input via an enabling device which is responsive to said another pre-decoded address signal; a plurality of series connected inverters connected to said first node of said second signal path for generating another column select signal; and a plurality of transistors interconnected so as to supply one of said precharge signal and said fixed voltage to said first node of said second signal path in response to said another said column select signal.

8. The decoder of claim 7 wherein said plurality of series connected inverters of said first signal path and said plurality of series connected inverters of said second signal path each comprises:
   a first inverter having an input connected to said first node and an output connected to a second node;
   a second inverter having an input connected to said second node and an output connected to a third node; and
   a third inverter having an input connected to said third node and an output.

9. The decoder of claim 8 wherein said plurality of transistors of said first signal path and said plurality of transistors of said second signal path each comprises:
   a first transistor having a gate terminal connected to said third node, said first transistor operable to supply said precharge signal to said first node;
   a second transistor having a gate terminal connected to said second node, said second transistor operable to supply said precharge signal to said first node; and
   a third transistor having a gate terminal connected to said second node, said third transistor operable to supply said fixed voltage to said first node.

10. The decoder of claim 9 wherein said third transistor of each of said first and said second signal paths is sized to be overridden when said enabling device of said first and said second signal paths, respectively, is conductive.

11. The decoder of claim 9 wherein one of said first and said second transistors of each signal path is a p-type transistor, and the other of said first and said second transistors is an n-type transistor.

12. The decoder of claim 9 wherein one of said second and said third transistors of each signal path is a p-type transistor, and the other of said second and third transistors is an n-type transistor.

13. The decoder of claim 7 wherein said input comprises a p-type transistor and an n-type transistor each receiving at a gate terminal one of said plurality of pre-decoded address signals, a source terminal of said n-type transistor receiving another one of said pre-decoded address signals, a source terminal of said p-type transistor connected to a fixed voltage source, a drain terminal of said p-type transistor connected to said enabling device of said first signal path, and a drain terminal of said n-type transistor connected to said enabling device of said second signal path.

* * * * *